(12) United States Patent
Huang

(10) Patent No.: US 7,722,406 B2
(45) Date of Patent: May 25, 2010

(54) OUTPUT ADAPTING DEVICE OF PLUG-IN POWER SYSTEM

(75) Inventor: Yung-Hsin Huang, Taipei Hsien (TW)

(73) Assignee: Zippy Technology Corp., Taipei-Hsien (TW)

( * ) Notice: Subject to any disclaimer, the term of this patent is extended or adjusted under 35 U.S.C. 154(b) by 0 days.

(21) Appl. No.: 12/049,807

(22) Filed: Mar. 17, 2008

(65) Prior Publication Data

US 2009/0233460 A1     Sep. 17, 2009

(51) Int. Cl.
*H01R 25/00*     (2006.01)
(52) U.S. Cl. ..................................... 439/638
(58) Field of Classification Search ................. 439/638, 439/76.1, 502, 49, 170, 941
See application file for complete search history.

(56) References Cited

U.S. PATENT DOCUMENTS

| | | | | |
|---|---|---|---|---|
| 5,299,956 | A * | 4/1994 | Brownell et al. | 439/638 |
| 5,310,363 | A * | 5/1994 | Brownell et al. | 439/676 |
| 5,362,257 | A * | 11/1994 | Neal et al. | 439/676 |
| 5,414,393 | A * | 5/1995 | Rose et al. | 333/1 |
| 5,454,738 | A * | 10/1995 | Lim et al. | 439/676 |
| 5,567,180 | A * | 10/1996 | Seo | 439/638 |
| 5,928,009 | A * | 7/1999 | Lee | 439/131 |
| 5,931,703 | A * | 8/1999 | Aekins | 439/676 |
| 6,057,610 | A * | 5/2000 | Nierescher | 307/72 |
| 6,077,125 | A * | 6/2000 | Emery | 439/638 |
| 6,152,778 | A * | 11/2000 | Dalton | 439/638 |
| 6,174,206 | B1 * | 1/2001 | Yentile et al. | 439/638 |
| 6,321,340 | B1 * | 11/2001 | Shin et al. | 713/310 |
| 6,394,835 | B1 * | 5/2002 | Milner et al. | 439/404 |
| 6,447,339 | B1 * | 9/2002 | Reed et al. | 439/638 |
| 6,488,542 | B2 * | 12/2002 | Laity | 439/676 |
| 6,488,545 | B1 * | 12/2002 | Meyer | 439/680 |
| 6,520,807 | B2 * | 2/2003 | Winings | 439/676 |
| 6,533,618 | B1 * | 3/2003 | Aekins | 439/676 |
| 6,537,109 | B1 * | 3/2003 | Emery | 439/638 |
| 6,604,963 | B2 * | 8/2003 | Lin | 439/607 |
| 6,859,854 | B2 * | 2/2005 | Kwong | 710/315 |

(Continued)

FOREIGN PATENT DOCUMENTS

TW     I259753     2/2006

(Continued)

*Primary Examiner*—T C Patel
*Assistant Examiner*—Vladimir Imas
(74) *Attorney, Agent, or Firm*—Muncy, Geissler, Olds & Lowe, PLLC

(57) ABSTRACT

An output adapting device of a plug-in power system is used to connect an output terminal of the plug-in power system with an input terminal of an electronic device, so as to transmit the power from the plug-in power system to the electronic device. The adapting device includes an output adapting terminal and an input adapting terminal respectively corresponding to the output terminal and the input terminal, in which corresponding pins of the corresponding terminals have identical potential, and at least one corresponding pair of pins of the output adapting terminal and the input adapting terminal have different potential. Furthermore, the adapting device also includes an adapting unit for adapting and outputting the power from the output adapting terminal to another pin with identical potential of the input adapting terminal. Therefore, the output terminal of the plug-in power system can be standardized for widely applying in various electronic devices.

6 Claims, 4 Drawing Sheets

U.S. PATENT DOCUMENTS

| | | | |
|---|---|---|---|
| 6,875,059 B2 * | 4/2005 | Sivertsen | 439/638 |
| 6,905,370 B2 * | 6/2005 | Blackwell | 439/638 |
| 7,154,049 B2 * | 12/2006 | Celella et al. | 174/261 |
| 7,268,294 B2 * | 9/2007 | Ohkawa et al. | 174/53 |
| 7,354,280 B2 * | 4/2008 | Gordon et al. | 439/76.2 |
| 7,393,248 B2 * | 7/2008 | Best et al. | 439/638 |
| 2003/0032333 A1 * | 2/2003 | Kwong | 439/638 |
| 2004/0087215 A1 * | 5/2004 | Pohl et al. | 439/638 |
| 2004/0180580 A1 * | 9/2004 | Pepe et al. | 439/638 |
| 2004/0229513 A1 * | 11/2004 | Blackwell | 439/638 |
| 2006/0163948 A1 * | 7/2006 | Kim et al. | 307/18 |
| 2007/0161296 A1 * | 7/2007 | Carroll et al. | 439/676 |
| 2007/0254530 A1 * | 11/2007 | Martich et al. | 439/676 |
| 2007/0259572 A1 * | 11/2007 | Celella et al. | 439/676 |

FOREIGN PATENT DOCUMENTS

TW        M306351        8/2007

\* cited by examiner

OUTPUT ADAPTING DEVICE OF PLUG-IN POWER SYSTEM

FIELD OF THE INVENTION

The present invention is related to an output adapting device of plug-in power system, and more particularly to an adapting device for transmitting power from plug-in power system to various electronic devices.

BACKGROUND OF THE INVENTION

Power supply is used to convert city electricity into DC power for the electronic apparatus. Take PC (Personal Computer) as example. Generally, the power supplies used for PC have two kinds of standards, AT and ATX, which respectively support motherboards with different standards (which are decided by the level of CPU used therein). Currently, no matter what the standard the power supply is, the power output is always achieved by connecting a bundle of several power output lines, which includes power plug, to the power socket of the system and then supplying power to the system (for example, for supplying power to the mother board and/or the related peripherals).

When the user wants to upgrade the peripherals in the computer, such as, CD burner, hard disk drive, or interface cards for particular functions, for normally operating the peripherals, usually, the power supply might also be upgraded for providing more powers so as to avoid the power supply from insufficiency. However, when exchanging the power supply for upgrading or maintaining, there are many connectors connected thereto have to be pulled out, for example, the connectors between the power supply and the motherboard, the hard disk drive and CD-ROM drive. In this manner, not only the operation consumes time and work, the power connector or the power line also might easily be broken. Although the power output lines of some power supplies are designed to be easily removed, the frequent assembling and disassembling are still inconvenient.

Therefore, a power supply which is directly plugged in the electronic apparatus is developed, so as to solve the problems described above. For example, R.O.C. Patent No. M306351, entitled "Improved Power Supply Structure", provides a plug-in power supply, in which the power supply and the computer mainframe, which needs power supply, respectively have corresponding power connecting port and power socket, so as to form the electric connection therebetween. Moreover, R.O.C. Patent NO. I259753, entitled "Removing Mechanism of Removable Power Supply Module", discloses a removable power supply including a power connector unit, wherein the power connector unit includes a connector socket and a connector plug which can be connected with each other, and the connector plug is fixedly mounted at one end of the removable power supply and the connector socket is connected with the power circuit of the computer mainframe.

Consequently, the power supply and the electronic apparatus have to equip with corresponding connecting terminals of identical transmission interface or standard and capable of assembling with each other, so that the power supply can be fixedly plugged into the electronic apparatus for providing power. However, since the electronic apparatuses in the market are numerous and possibly equipped with different connecting terminals, for example, different potentials of connecting pins, the electronic apparatuses have to be supplied by power supplies with particular connecting terminals, namely, one kind of power supply might only be suitable for only one single electronic apparatus and can not be adjusted or changed for applying to other electronic apparatuses, thereby limiting the application of power supply.

SUMMARY OF THE INVENTION

The object of the present invention is to provide a plug-in power system whose output terminal can be adapted to all kinds of electronic devices.

For achieving the object described above, the present invention provides an output adapting device of plug-in power system for connecting an output terminal of the plug-in power system with an input terminal of an electronic device, so as to transmit the power from the plug-in power system to the electronic device. The adapting device includes an output adapting terminal and an input adapting terminal respectively corresponding to the output terminal and the input terminal, in which corresponding pins of the corresponding terminals have identical potential, and at least one corresponding pair of pins of the output adapting terminal and the input adapting terminal have different potential. Furthermore, the adapting device also includes an adapting unit for adapting and outputting the power from the output adapting terminal to another pin with identical potential of the input adapting terminal. Therefore, through the adapting device connecting pins of identical potential of the output adapting terminal and the input adapting terminal together, the output terminal of the plug-in power system can connect with different input terminals of electronic devices without changing.

Compared with prior art, the present invention facilitates the standardization of the output terminal of the plug-in power system, so that the adapting device can be applied in various electronic devices.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DESCRIPTION OF THE PREFERRED EMBODIMENT

Figure 1:
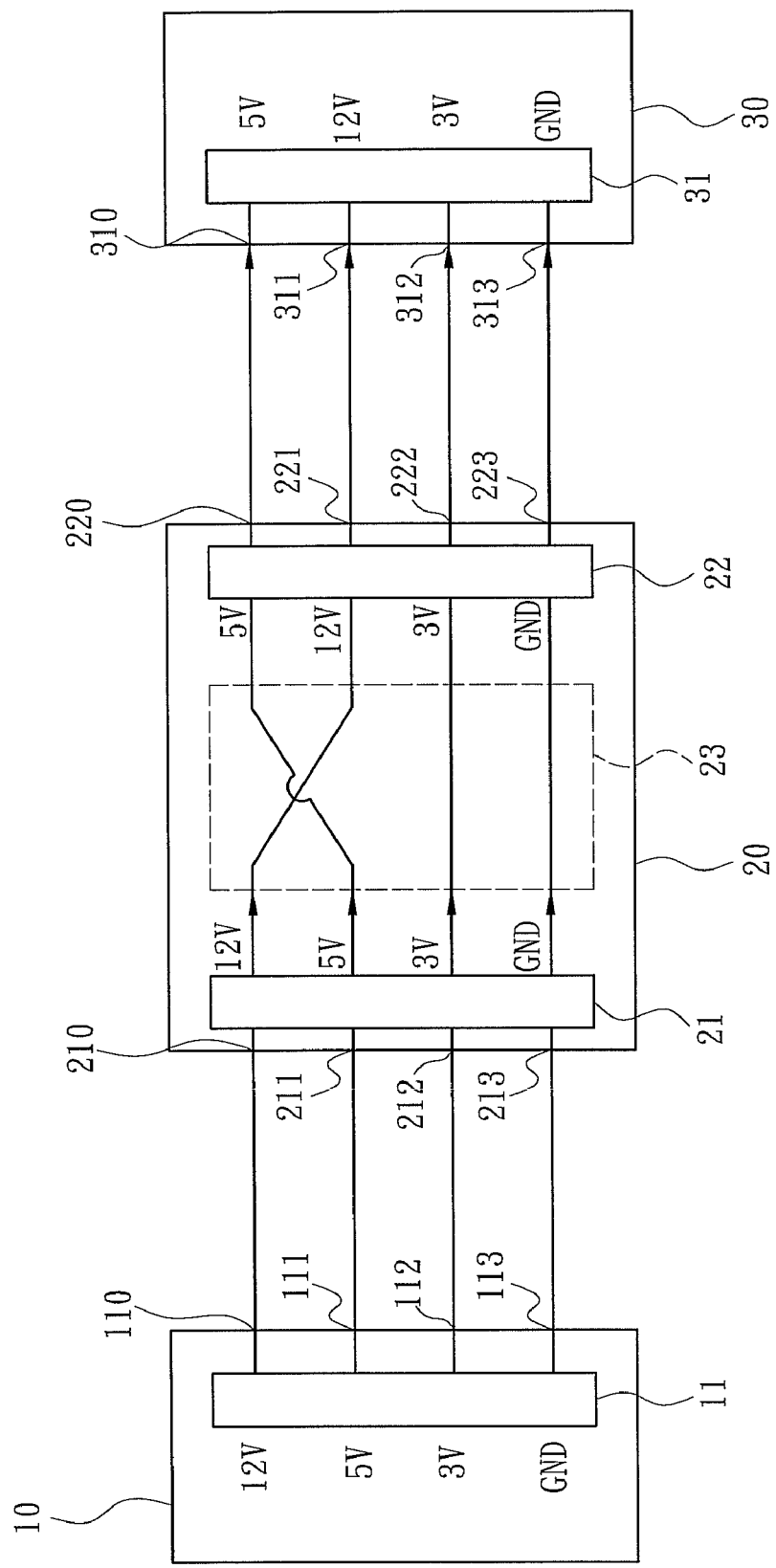
FIG. 1 is a schematic view showing an embodiment of the present invention.

Please refer to FIG. 1, which shows an output adapting device of a plug-in power system. The present invention is related to an adapting device 20 for connecting a plug-in power system 10 (such as power supply) to an electronic device 30 (such as computer mainframe), so that the power from the plug-in power system 10 can be transmitted to the electronic device 30 so as to drive the electronic device 30 to operate. As shown in FIG. 1, the plug-in power system 10 and the electronic device 30 respectively have an output terminal 11 and an input terminal 31 which respectively have plural pins 110~113 and 310~313, and the adapting device 20 includes an output adapting terminal 21 and an input adapting terminal 22 which respectively nave plural corresponding pins 210~213 and 220~223, wherein pins 110~113 and pin 210~213 correspondingly have identical potential and pins 310~313 and pins 220~223 correspondingly have identical potential. In the present invention, the output terminal 11 and the output adapting terminal 21 can be correspondingly assembled connectors, such as gold finger, socket or printed circuit board, and so as the input terminal 31 and the input adapting terminal 22. Moreover, the adapting device 20 further has an adapting unit 23 for electrically connecting the output adapting terminal 21 with the input adapting terminal 22, wherein the adapting unit 23 can be a printed circuit board, so that pins 210~213 of the output adapting terminal 21 can be connected to pins 220~223, which have identical potential to pins 210~213 of the input adapting terminal 22.

In an embodiment, at the output adapting terminal 21 and the input adapting terminal 22, at least one pin 210, 211, 220, 221 has different potential. As shown in FIG. 1, the pins 110~113 and 210~213 of the output terminal 11 and the output adapting terminal 21 are sequentially defined as 12V, 5V, 3V and GND from up to down, and the pins 310~313 and 220~223 of the output terminal 31 and the output adapting terminal 22 are sequentially defined as 5V, 12V, 3V and GND from up to down, thereby the plug-in power system 10 can not directly joint with the electronic device 30 for transmitting power. The plug-in power system 10 transmits power to the adapting device 20 through the output terminal 11 and the output adapting terminal 21, and the adapting unit 23 also connect pins 210~213 to pins 220~223 which have identical potential. More specifically, in the adapting unit 23, it defines that 12V pin 210 of the output adapting terminal 21 is cross-connected to pin 221 of the input adapting terminal 22, 5V pin 211 is cross-connected to pin 220 of the input adapting terminal 22, and pins 212, 213 of 3V and GND are transmitted to pins 222, 223 in parallel, thereby the power from the plug-in power system 10 is adapted and transmitted to the electronic device 30, so as to drive the electronic device 30 to operate. It should be noticed that the quantity of pins 210~213, 220~223 of the output adapting terminal 21 and the input adapting terminal 22 in the adapting device 20 is not limited and can be adjusted or changed according to the output terminal 11 of the plug-in power system 10 and the input terminal 31 of the electronic device 30.

Figure 2:
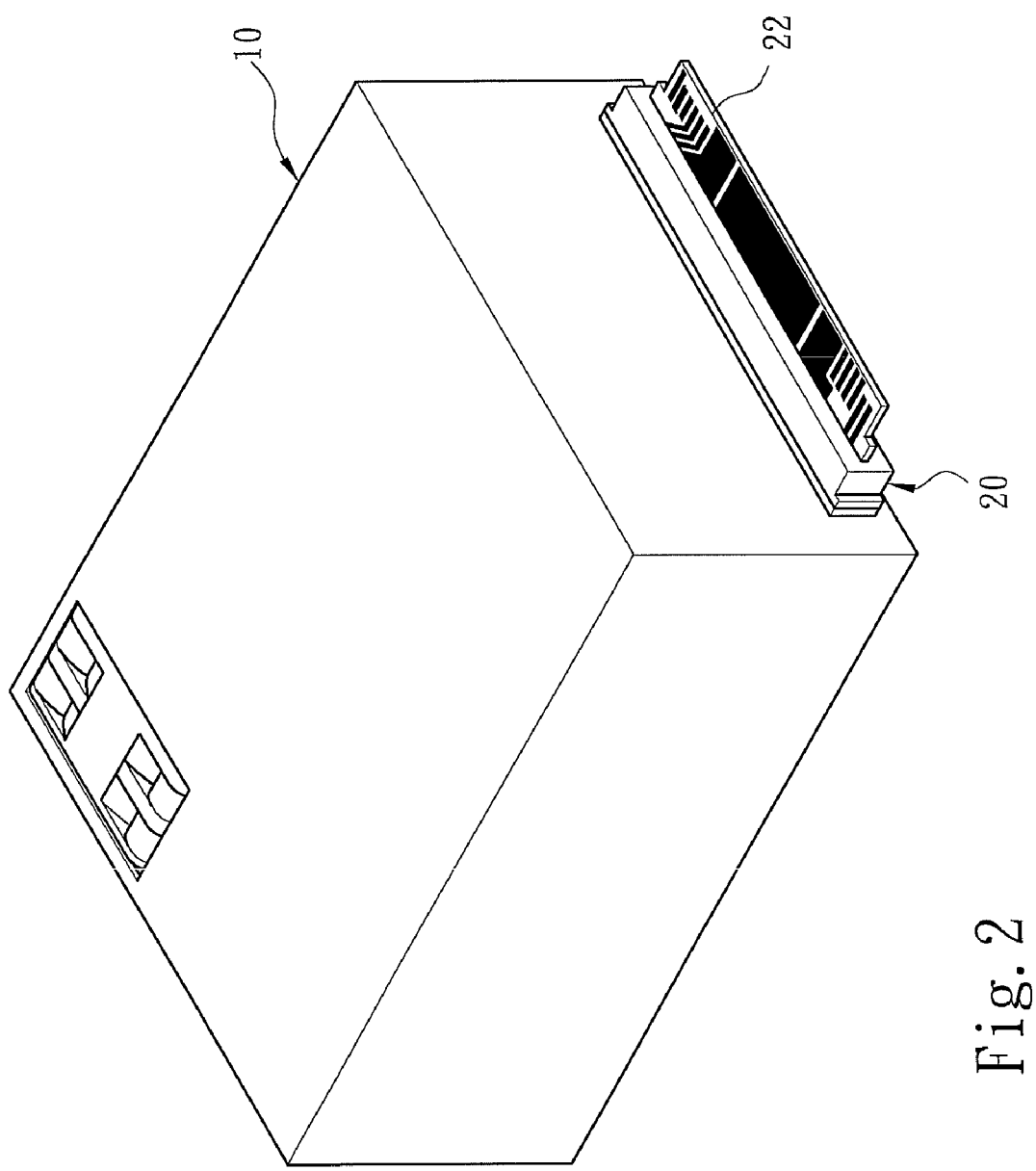
FIG. 2 is a schematic view showing the appearance of the present invention.
Figure 3:
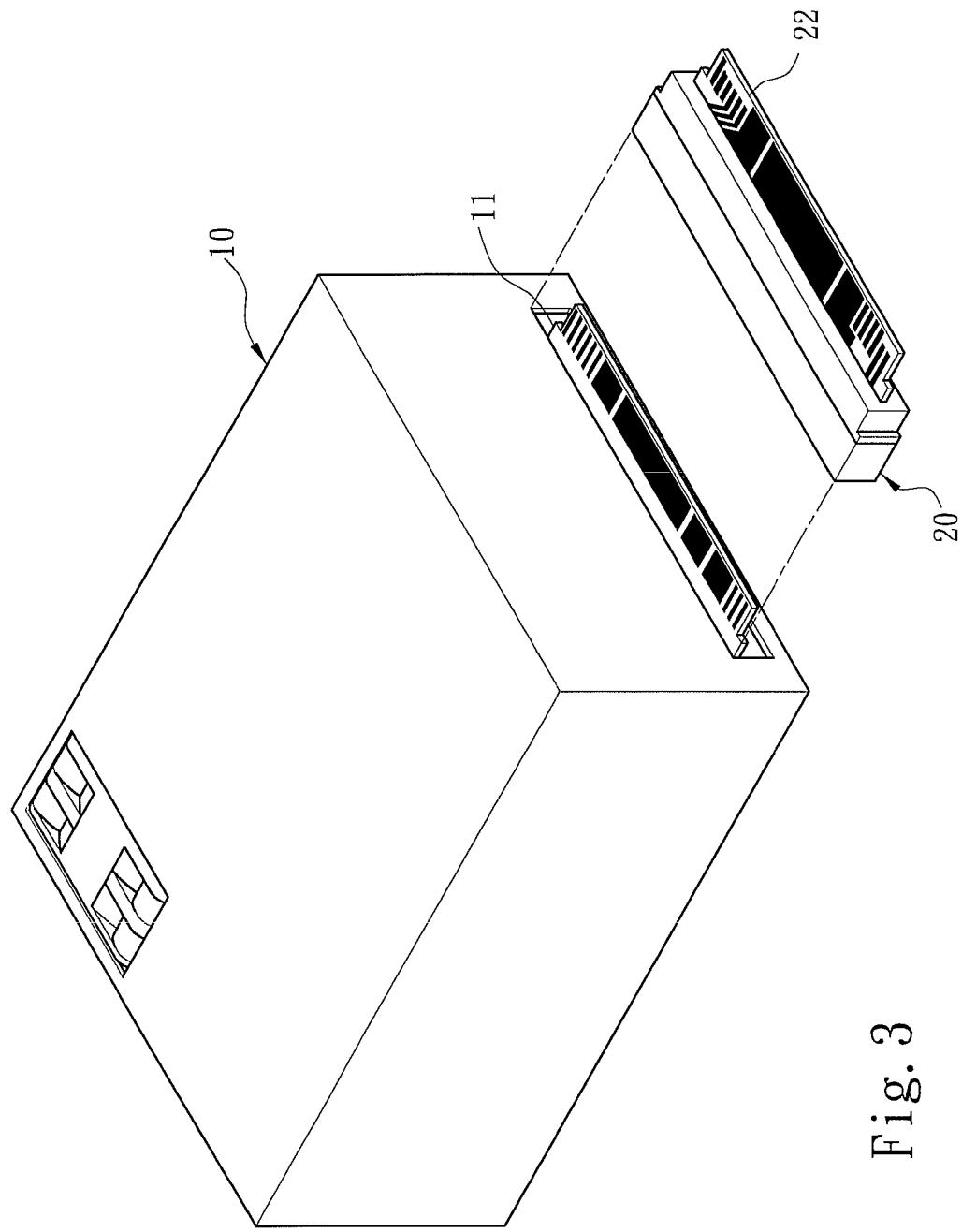
FIG. 3 is a decomposition drawing showing the present invention.
Figure 4:
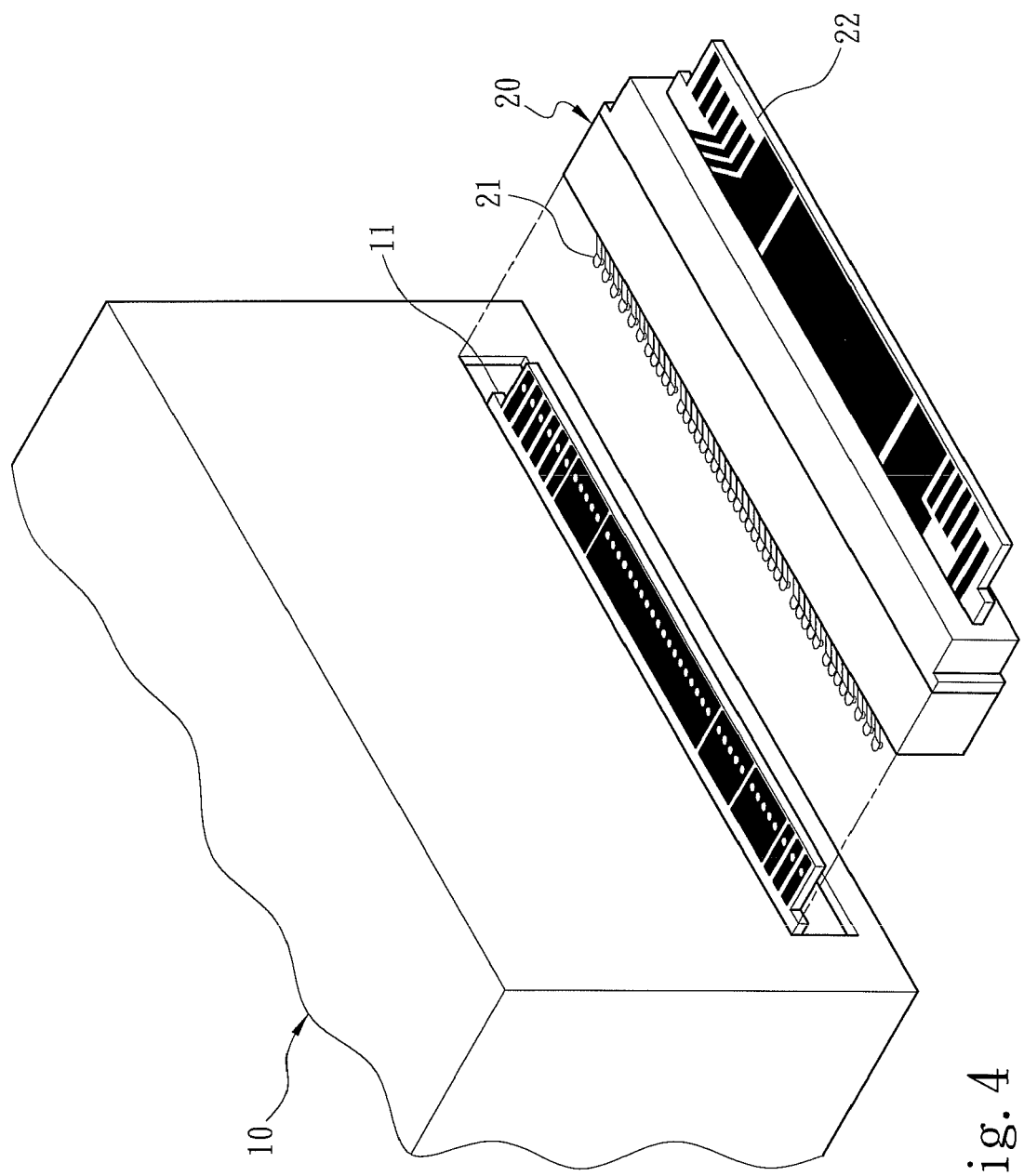
FIG. 4 is a decomposition drawing in another embodiment of the present invention.

Through the adapting unit 23 of the adapting device 20, the power at pins 110~113 of the plug-in power system 10 can be transmitted to pins 310~313 of the electronic device 30 with identical potential. As shown in FIG. 2 and FIG. 3, the output terminal 11 of the plug-in power system 10 are gold fingers and are plugged in the gold finger slots (not shown) of the output adapting terminal 21, and the input adapting terminal 22 is connected with gold fingers of the electronic device 30 for adapting power. Besides, as shown in FIG. 4, the output terminal 11 can be a printed circuit board, and the output adapting terminal 21 can be pins for being soldered on and connected with the output terminal 11, so as to transmit power to the electronic device 30 through the input adapting terminal 22. Through the architecture described above, the plug-in power system 10 does not need to change the output terminal 11 thereof for adapting to different input terminals 31 of various electronic devices 30 since the adapting device 20 can replace the output terminal 11 by the input adapting terminal 22, which is corresponding to the input terminal 31 of the electronic device 30.

Consequently, in the present invention, through utilizing the adapting device 20, the output terminal 11 of the plug-in power system 10 only needs to have one single standard and the plug-in power system 10 still can be applied to all kinds of electronic devices 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An output adapting device of a plug-in power system, the adapting device being connected between an output terminal and an input terminal which are respectively mounted on the plug-in power system and an electronic device, so as to transmit power from the plug-in power system to the electronic device, wherein:

the adapting device comprises an output adapting terminal and an input adapting terminal respectively corresponding to the output terminal and the input terminal, in which corresponding pins of the corresponding terminals have identical potential, a ground pin and one other pin of the output adapting terminals have the same potential as corresponding pins of the input adapting circuit and at least one corresponding pair of pins of the output adapting terminal and the input adapting terminal have different potential, and further, the adapting device comprises an adapting unit for adapting and transmitting the power from the output adapting terminal to another pin with identical potential of the input adapting terminal.

2. The device as claimed in claim 1, wherein the adapting device is a printed circuit board.

3. The device as claimed in claim 1, wherein the output terminal and the output adapting terminal are a connector pair selected from gold finger, socket and printed circuit board.

4. The device as claimed in claim 1, wherein the input terminal and the input adapting terminal are a connector pair selected from gold finger, socket and printed circuit board.

5. The device as claimed in claim 1, wherein said plug-in power system generates DC power signals on said output terminals in order to power said electronic device through said input terminals.

6. The device as claimed in claim 1, wherein said output adapting device permits the plug-in power system to comply with different power standards.

* * * * *